United States Patent [19]
Loh et al.

[11] Patent Number: 5,516,707
[45] Date of Patent: May 14, 1996

[54] LARGE-TILTED-ANGLE NITROGEN IMPLANT INTO DIELECTRIC REGIONS OVERLAYING SOURCE/DRAIN REGIONS OF A TRANSISTOR

[75] Inventors: Ying-Tsong Loh, Saratoga; Lily Ding, Fremont; Edward D. Nowak, Pleasanton, all of Calif.

[73] Assignee: VLSI Technology, Inc., San Jose, Calif.

[21] Appl. No.: 489,525

[22] Filed: Jun. 12, 1995

[51] Int. Cl.⁶ .................................................. H01L 21/265
[52] U.S. Cl. .................................. 437/24; 437/35; 437/29
[58] Field of Search ................................... 437/35, 24, 29

[56] References Cited

U.S. PATENT DOCUMENTS

| | | | |
|---|---|---|---|
| 5,223,445 | 6/1993 | Fuse | 437/35 |
| 5,270,227 | 12/1993 | Kameyama et al. | 437/35 |
| 5,360,749 | 11/1994 | Anjum et al. | 437/35 |

OTHER PUBLICATIONS

H. S. Momose, T. Morimoto, Y. Ozawa, M. Tsuchiaki, M. Ono, K. Yamabe and H. Iwai, *Very Lightly Nitrided Oxide Gate MOSFETs for Deep–Submicron CMOS Devices*, IEDM Tech. Dig., p. 359, 1991.

S. Kusunoki, M. Inuishi, T. Yamaguchi, K. Tsukamoto and Y. Alasaka, *Hot–Carrier–Resistant Structure by Re–Oxidized Nitrided Oxide Sidewall for Highly Reliable and High Performance LDD MOSFETs*, IEDM Tech. Digest, p. 649, 1991.

Y. Okada, et al. The Performance and Reliability of 0.4 micron MOSFET's with Gate Oxynitrides Grown by Rapid Thermal Processing Using Mixtures of $N_2O$ and $O_2$, Trans. Electron Devices, vol. 41, p. 191, Feb. 1994.

T. Kuroi, et al., *Novel NICE (Nitrogen Implantation into CMOS Gate Electrode and Source–Drain) Structure for High Reliability and High Performance 0.25 μm Dual Gate CMOS*, IEDM Tech Dig. p. 325, 1993.

Y. Okada, P. Tobin, K. Reid, R. Hegde, B. Maiti and S. Ajuria, *Furnace Grown Gate Oxynitride Using Nitric Oxide (NO)*, Trans. Electron Devices, vol. 41, p. 1608.

*Primary Examiner*—Tom Thomas
*Assistant Examiner*—Lynne A. Gurley
*Attorney, Agent, or Firm*—Douglas L. Weller

[57] ABSTRACT

A transistor is formed which has improved hot carrier immunity. On a substrate, between two source/drain regions, a gate region is formed over a dielectric region. An implant is used to dope the source/drain regions. After doping the source/drain regions, a tilted angle nitrogen implant is performed to implant nitrogen into areas of the dielectric region overlaying the drain/source regions of the transistor. The tilted angle nitrogen implant may be performed before or after forming spacer regions on sides of the gate region.

3 Claims, 4 Drawing Sheets

LARGE-TILTED-ANGLE NITROGEN IMPLANT INTO DIELECTRIC REGIONS OVERLAYING SOURCE/DRAIN REGIONS OF A TRANSISTOR

BACKGROUND

The present invention concerns the field of integrated circuit manufacture and pertains particularly to performing a large-tilted-angle nitrogen implant into areas of a dielectric region overlaying the source/drain regions of a transistor.

As channel lengths for MOSFETs are scaled to significantly less than a micron (e.g., 0.5 microns and below), hot carrier related reliability continues to be a critical device design constraint. Reduction of the power supply voltage to 3.3 volts and below improves hot carrier lifetimes, but is not sufficient to meet reliability goals.

Incorporating nitrogen into the silicon and silicon dioxide (Si—$SiO_2$) interfacial regions under the gate layer has been found to improve hot carrier immunity. See, for example, H. S. Momose, T. Morimoto, Y. Ozawa, M. Tsuchiaki, M. Ono, K. Yamabe and H. Iwai, *Very Lightly Nitrided Oxide Gate MOSFETs for Deep-Submicron CMOS Devices*, IEDM Tech. Dig., p. 359, 1991; S. Kusunoki, M. Inuishi, T. Yamaguchi, K. Tsukamoto and Y. Akasaka, *Hot-Carrier-Resistant Structure by Re-Oxidized Nitrided Oxide Sidewall for Highly Reliable and High Performance LDD MOSFETs*, IEDM Tech. Digest, p. 649, 1991; Y. Okada, P. J. Tobin, P. Rushbrook, and W. L. Dehart, *The Performance and Reliability of 0.4 micron MOSFET's with Gate Oxynitrides Grown by Rapid Thermal Processing Using Mixtures of $N_2O$ and $O_2$*, Trans. Electron Devices, Vol. 41, p. 191, February 1994; T. Kuroi, T. Yamaguchi, M. Shirahata, Y. Okumura, Y. Kawasaki, M. Inuishi and N. Tsubouchi, *Novel NICE (Nitrogen Implantation into CMOS Gate Electrode and Source-Drain) Structure for High Reliability and High Performance 0.25 μm Dual Gate CMOS*, IEDM Tech Dig. p. 325, 1993.

Various techniques are available to convert the thermally grown gate oxide into oxynitride. For example, the thermally grown gate oxide may be converted into oxynitride by high temperature anneal of the grown gate oxide in $NH_3$, $N_2O$ or NO. Alternately, nitrogen may be implanted into the polysilicon gate. Both techniques have disadvantages.

For example, when a high temperature anneal to produce the oxynitride gate dielectric, this requires the additional high temperature processing which is incompatible with submicron device fabrication. The implantation of nitrogen and drive-in through the polysilicon gate results in fixed charge generation which degrades mobility at low electric field.

SUMMARY OF THE INVENTION

In accordance with the preferred embodiment of the present invention, a method is presented for producing a transistor with improved hot carrier related reliability. On a substrate, between two source/drain regions, a gate region is formed over a dielectric region. An implant is used to dope the source/drain regions. After doping the source/drain regions, a tilted angle nitrogen implant is performed to implant nitrogen into areas of the dielectric region overlaying the drain/source regions of the transistor. The tilted angle nitrogen implant may be performed before or after forming spacer regions on sides of the gate region. For example, the tilted angle nitrogen implant is performed at an angle of tilt of approximately 30 to 60 degrees. The implant dose is approximately $10^{15}$ to $10^{16}$ atoms per square centimeter and the energy is approximately 30 KeV to 60 KeV.

The present invention has significant advantages over prior techniques. For example, the use of large tilted angle implanted nitrogen limits the nitrogen incorporation to the drain gate overlap region where hot carrier damage occurs. The gate stack shields the channel region preventing mobility degradation caused by fixed charge generation.

Further, implantation of the nitrogen into $p^+$ source/drain regions may locally increase the Boron surface concentration through transient enhanced diffusion. This will decrease $p^+$ contact resistances.

Also, the present invention is compatible with deep submicron device fabrication and minimizes manufacturing cost. No additional photo-masking or implant anneal is required.

DESCRIPTION OF THE PREFERRED EMBODIMENT

Figure 1:
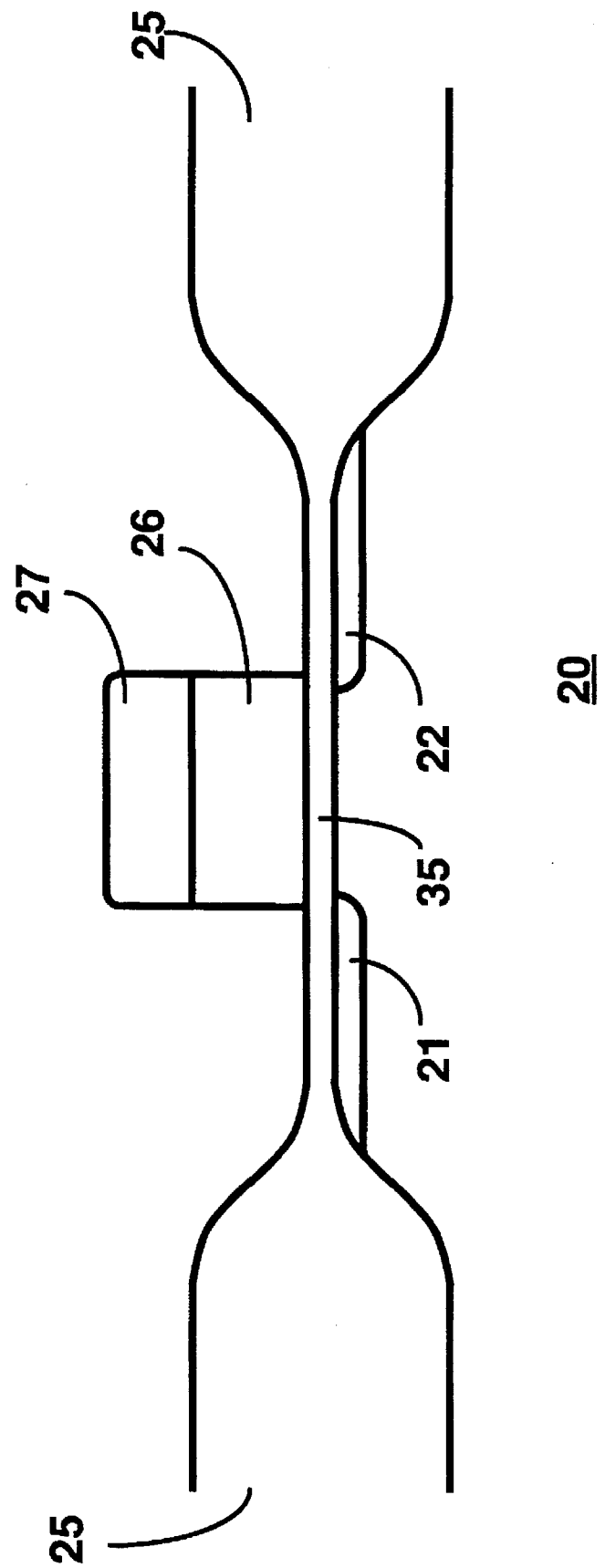
FIG. 1, FIG. 2, FIG. 3 and FIG. 4 illustrate processing steps used for producing a transistor in accordance with the preferred embodiments of the present invention.

The structure shown in FIG. 1 is formed in a well 20 of first conductivity type within a substrate. For example, the substrate may be of p-type material doped with $10^{15}$ atoms per cubic centimeter. Alternately, the substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide 35 is formed (i.e. grown or deposited) on exposed portions of the substrate. A first gate region 26 is formed on gate oxide layer 35 using a mask and etch process. First gate region 26 may be made of polysilicon, for example, doped with n-type atoms at $10^{20}$ atoms per cubic centimeter.

Gate region 26 may be formed, for example, by chemical vapor deposition (CVD) of a polysilicon layer. The polysilicon is in-situ doped or using $POCl_3$. Alternately, an implant of Phosphorus or Arsenic atoms may be used. If a polycide gate is desired, a metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On top of the polysilicon (or polycide) layer there may be deposited a dielectric layer. The deposition of the dielectric layer is done, for example, using chemical vapor deposition (CVD) oxide. Alternately, deposition of the dielectric layer may be omitted. Using a mask, an etch is performed on both sides of a metal-silicide region 27 on top of first gate region 26. The etch exposes the gate oxide layer on top of the substrate.

On the sides of gate region 26 and region 27 are implanted a region 21 and a region 22 of second conductivity type. Region 21 and region 22 act as source/drain regions for a transistor. For example, region 21 and region 22 are n⁻ regions doped with Phosphorus at $10^{18}$ atoms per cubic centimeter. For example, region 21 and region 22 extend from 0.10 to 0.15 micrometers below the surface of the substrate. Alternately, region 21 and region 22 may be p⁻ regions. The resultant structure is shown in FIG. 1.

Figure 2:
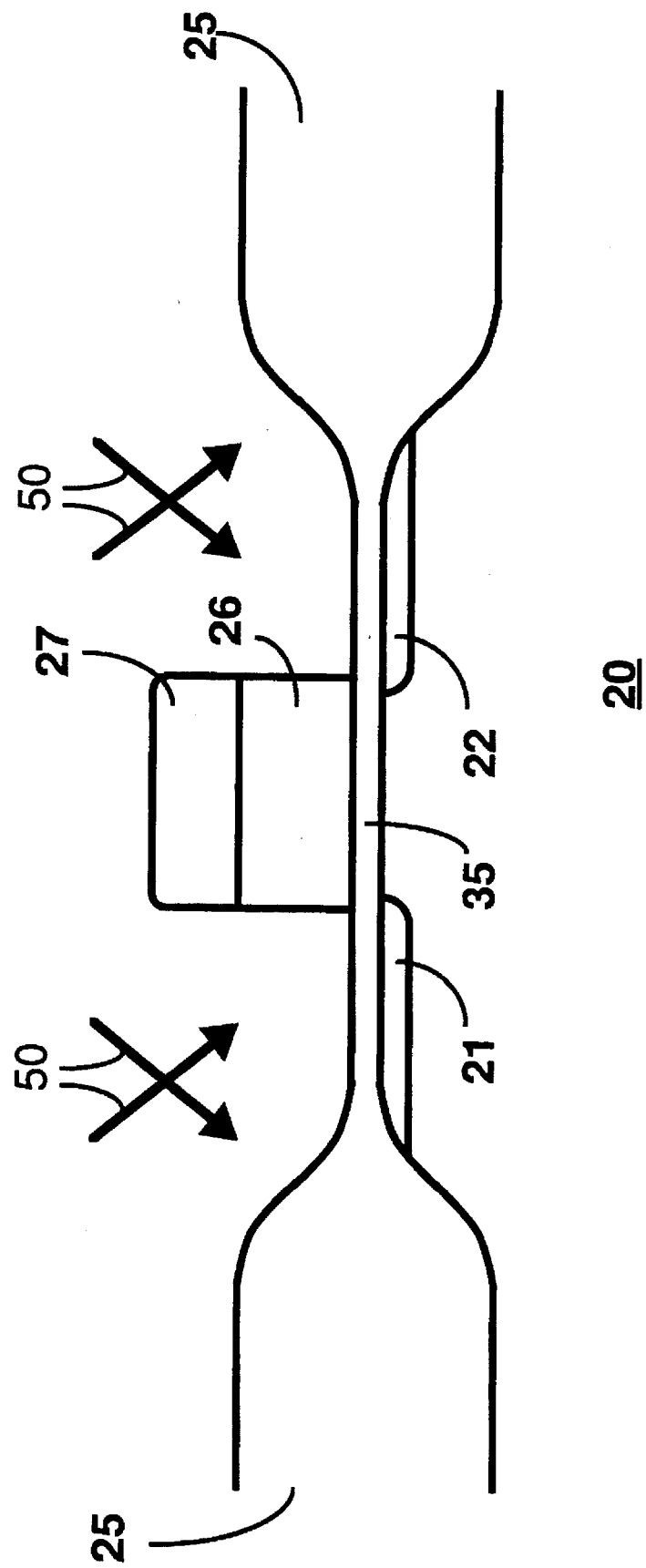

FIG. 2 shows Nitrogen being incorporated locally into gate oxide layer 35 immediately above source/drain regions 21 and 22 using a large tilted angle implant technique, as illustrated by arrows 50. In this way oxynitride is formed only in the area susceptible to hot carrier degradation effects. In FIG. 2, the nitrogen implant is shown being performed before spacer formation. Alternately, the nitrogen implant may be performed after spacer formation.

The nitrogen concentration and the length of the drain gate overlap regions incorporating nitrogen can be optimized by controlling the implant dose, energy and tilted angle. For example, the implant dose is $10^{15}$ atoms per square centimeter, the energy is 60 KeV and the tilted angle is 45 degrees. This results in a nitrogen concentration of greater than $10^{20}$ atoms per cubic centimeter and the length of the drain gate overlap regions incorporating nitrogen as approximately 900 Angstroms.

Figure 3:
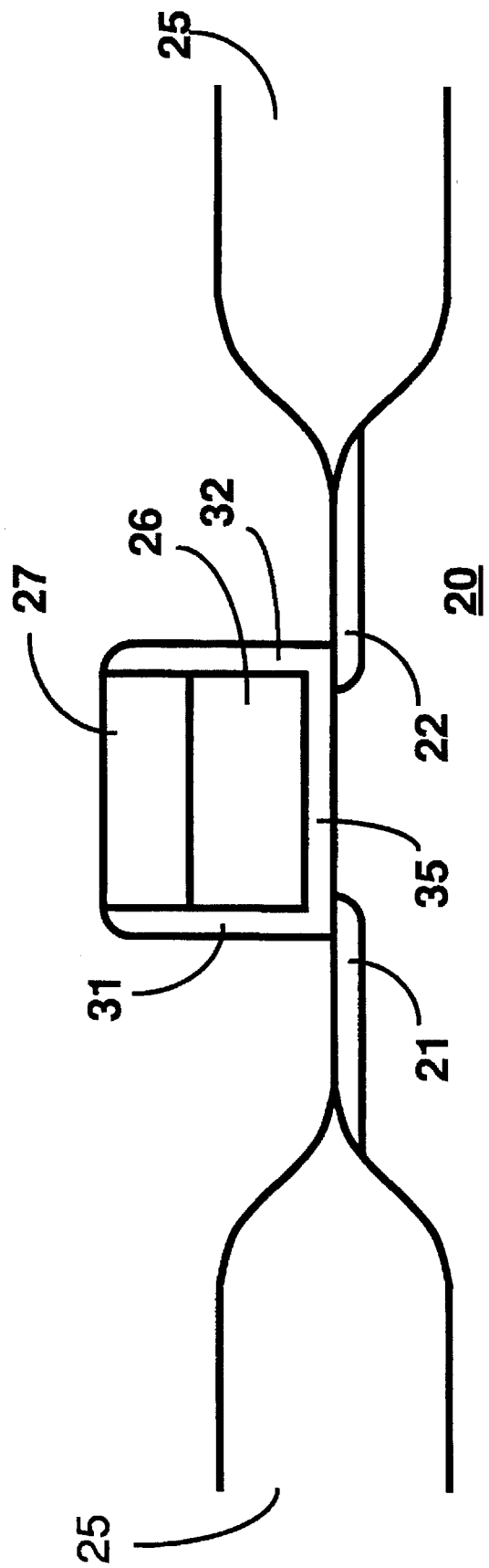

The exposed portions of the gate oxide layer 35 are dipped off using, for example, a fifty to one mixture of $H_2O$ and HF. A deposition and etch back are used to form a sidewall region 31 and a sidewall region 32, which are on opposite sides of polysilicon region 26. Sidewall region 31 and sidewall region 32 serve as spacers around polysilicon region 26. Sidewall region 31 and sidewall region 32 may be formed, for example by oxide deposition and etch back. Alternately, sidewall region 31 and sidewall region 32 may be formed by nitride deposition and etch back. For example, sidewall region 31 and sidewall region 32 are CVD oxide and each extends approximately 0.15 to 0.25 microns outward from polysilicon region 26. A dilute Hydrogen-Fluorine (HF) dip may be used to clear residual oxide over source/drain region 21 and source/drain region 22. The resulting structure is shown in FIG. 3.

Figure 4:
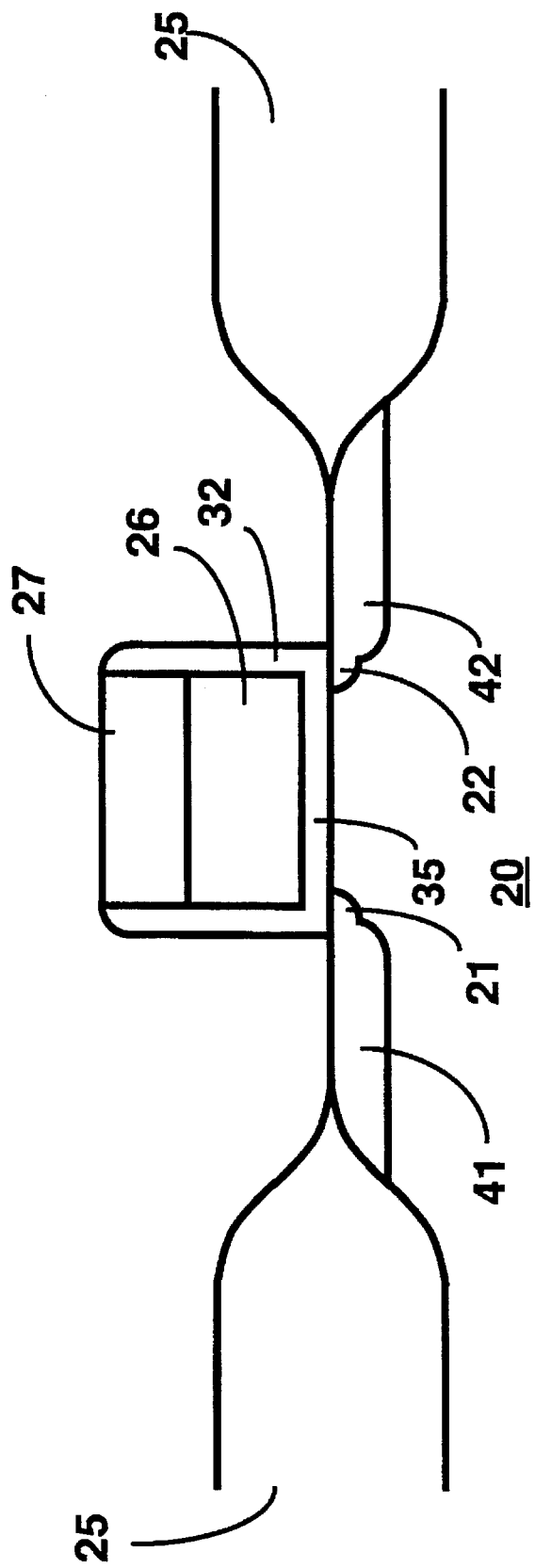

A source-drain implant can be performed on the circuit. For example, an ion implant is used to dope n⁺ source region 41 and n⁺ drain region 42 with n⁺-type (e.g., Arsenic) atoms at $10^{20}$ atoms per cubic centimeter. Region 41 and region 42 extend, for example, a depth of 0.15 to 0.25 microns below the surface of the substrate. Alternately, region 41 and region 42 may be p⁺-regions doped with, for example, Boron. The result is seen in FIG. 4.

Conventional methods may then be used to place an insulating layer over the surface of the substrate. For example, the insulating layer may be composed of a Boron Phosphor silicate glass (BPSG) layer on top of a TEOS layer. For example, the TEOS layer is 0.15 microns and the BPSG layer is 0.4 microns. The insulating layer is masked and etched. A metal layer is then deposited in contact with source/drain region 41 and source/drain region 42.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing a transistor, the method comprising the steps of:

(a) forming on a substrate between two source/drain regions, a gate region on top of a dielectric region, the dielectric region including areas which overlay the drain/source regions;

(b) performing an implant to dope the source/drain regions;

(c) performing a tilted angle nitrogen implant to implant nitrogen into the areas of the dielectric region overlaying the drain/source regions of the transistor: and, (d) forming spacer regions on sides of the gate region after the tilted angle nitrogen implant performed in step (c).

2. A method as in claim 1 wherein in step (c) the tilted angle nitrogen implant is performed at an angle of tilt of approximately 30 to 60 degrees.

3. A method as in claim 2 wherein the tilted angle nitrogen implant dose is approximately $10^{15}$ to $10^{16}$ atoms per square centimeter and the energy is approximately 30 KeV to 60 KeV.

* * * * *